(12) United States Patent
Huang

(10) Patent No.: US 9,673,061 B2
(45) Date of Patent: Jun. 6, 2017

(54) METHOD FOR THERMAL PROCESS IN PACKAGING ASSEMBLY OF SEMICONDUCTOR

(71) Applicant: Shun-Ping Huang, Hsinchu County (TW)

(72) Inventor: Shun-Ping Huang, Hsinchu County (TW)

(*) Notice: Subject to any disclaimer, the term of this patent is extended or adjusted under 35 U.S.C. 154(b) by 0 days.

(21) Appl. No.: 14/728,036

(22) Filed: Jun. 2, 2015

(65) Prior Publication Data
US 2016/0276168 A1 Sep. 22, 2016

Related U.S. Application Data

(60) Provisional application No. 62/134,153, filed on Mar. 17, 2015.

(51) Int. Cl.
*H01L 21/4763* (2006.01)
*H01L 21/324* (2006.01)
(Continued)

(52) U.S. Cl.
CPC .......... *H01L 21/324* (2013.01); *H01L 24/75* (2013.01); *H01L 24/81* (2013.01); *H01L 25/50* (2013.01); *H01L 23/562* (2013.01); *H01L 25/0652* (2013.01); *H01L 25/18* (2013.01); *H01L 2224/16145* (2013.01); *H01L 2224/16227* (2013.01); *H01L 2224/81203* (2013.01); *H01L 2224/81815* (2013.01); *H01L 2225/06513* (2013.01); *H01L 2225/06517* (2013.01); *H01L 2924/10253* (2013.01); *H01L 2924/157* (2013.01); *H01L 2924/1579* (2013.01); *H01L 2924/3511* (2013.01); *H01L 2924/37001* (2013.01)

(58) Field of Classification Search
CPC .......................... F28D 15/00; H05K 7/20327
See application file for complete search history.

(56) References Cited

U.S. PATENT DOCUMENTS 4,327,271 A 4/1982 Bentley
4,628,616 A 12/1986 Shirai
(Continued)

OTHER PUBLICATIONS

Katsuyuki Sakuma, Edmund Blackshear, Krishna Tunga, Chenzhou Lian, Shidong Li, Marcus Interrante, Oswald Mantilla, and Jae-Woong Nah; Flip Chip Assembly Method Employing Differential Heating/Cooling for Large Dies with Coreless Substrates, IBM Microelectronics Division.

*Primary Examiner* — Zandra Smith
*Assistant Examiner* — Andre' C Stevenson
(74) *Attorney, Agent, or Firm* — Rosenberg, Klein & Lee

(57) ABSTRACT

A method for thermal process in packaging assembly of semiconductor is disclosed. The high-pressure overheated vapor is injected into the process chamber. The overheated vapor becomes saturated vapor in atmosphere (1 ATM) immediately and generates condensed liquid film onto all the surface of semiconductor work and also the chamber walls as condensation phenomenon occurs. The process temperature of vapor condensation is very close to and never exceeds the boiling point of perfluorinated compounds (PFC). Therefore, the latent heat of the saturated vapor is transferred to semiconductor work through the surface of liquid film evenly and uniformly.

14 Claims, 11 Drawing Sheets

(51) Int. Cl.
    *H01L 25/00*     (2006.01)
    *H01L 23/00*     (2006.01)
    *H01L 25/065*    (2006.01)
    *H01L 25/18*     (2006.01)

(56) References Cited

U.S. PATENT DOCUMENTS

| | | | |
|---|---|---|---|
| 4,735,001 A | 4/1988 | Mishina | |
| 6,174,371 B1* | 1/2001 | Iseki | H01L 21/02 118/689 |
| 6,831,022 B1* | 12/2004 | Broyles | B01D 5/0054 438/773 |
| 8,381,966 B2 | 2/2013 | Kumar et al. | |
| 2003/0143837 A1* | 7/2003 | Gandikota | C23C 18/165 438/629 |
| 2004/0045184 A1* | 3/2004 | Takeshita | H01L 21/67017 34/218 |
| 2007/0187850 A1* | 8/2007 | Tomasel | F22B 3/04 261/131 |
| 2009/0188967 A1 | 7/2009 | Bell | |

* cited by examiner

METHOD FOR THERMAL PROCESS IN PACKAGING ASSEMBLY OF SEMICONDUCTOR

RELATED APPLICATION

This application claims the priority benefit of U.S. Provisional Application Ser. No. 62/134,153, filed on Mar. 17, 2015, the full disclosure of which is incorporated herein by reference.

BACKGROUND

1. Technical Field

The present invention relates to semiconductor process methods, and more particularly, to methods for thermal process in packaging assembly of semiconductor.

2. Description of the Related Art

Most of thermal processes in current semiconductor packaging assembly are to transfer the heat by conduction (hot plate), convection (gas or fluid) or radiation (infrared, laser, microwave or lamps). The curing, soldering reflow, thermal bonding and RTP (rapid thermal process) are now used in semiconductor manufacturing process.

Reference is now made to FIG. 3, which illustrates that a semiconductor work 121 includes heterogeneous chip combination (thin silicon chip 131, thick silicon chip 137 and stacked silicon chips 133) and substrate 135 (such as silicon wafer or organic substrate). FIG. 3-1 illustrates tiny metal joints 147 between the thin silicon chip 131 and substrate 135. The tiny metal joint 147 is composed of a copper post 141 of the thin silicon chip 131, solders or intermediate metal layers 143, and a copper pad 145 of the substrate 135.

Reference is now made to FIGS. 4 and 4-1, which illustrate one occasion of conventional radiation heating process, such as RTP (rapid thermal process). The IR lamp 151 generates radiation light and transfers heat onto the surface of chips 131, 133, 137 and substrate 135 through radiation light itself. Meanwhile the heat on the surface of the chips 131, 133, 137 and the substrate 135 is transferred into inner structures of the chips 131, 133, 137 and the substrate 135 by conduction. However, the radiation light cannot transit chips directly and the shadow area that the radiation light cannot reach does not receive the heat from radiation light.

Reference is now made to FIGS. 5 and 5-1, which illustrate one occasion of convection heating process, such as hot air heating process. The gas blower 161 generates heated airflows and transfers heat onto the surface of the chips 131, 133, 137 and the substrate 135 through airflows. Meanwhile the heat on the surface of the chips 131, 133, 137 and the substrate 135 is transferred into internal structures of the chips 131, 133, 137 and the substrate 135 by conduction. However, the airflow distribution depends on the shape and structure of chips.

Reference is now made to FIG. 6, which illustrates one occasion of conduction heating process, such as hot plate heating process. The hot plate heater 173 is composed of a hotplate in which electrodes 171 are placed. The hot plate heater 173 generates heat from the electrodes 171 and transfers the heat to the chips 131, 133, 137 and the substrate 135 by conduction. However, uneven contact surface will cause the heat transfer to the substrate 135 less equal.

The heat transfer processes which apply to the semiconductor work 121 by the above conventional heat transfer methods have the following phenomena: higher peak temperature, much more variations in temperature distribution and not easy control of temperature profile due to the warpage and the mismatch of coefficient of thermal expansion (CTE) between the substrate 135 and heterogeneous chip combination (thin silicon chip 131, thick silicon chip 137 and stacking silicon chips 133) during the thermal process. Therefore, the above conventional heat transfer methods to the semiconductor work 121 have the bad production yield during packaging assembly of semiconductor and the poor performance of chips consequently.

Accordingly, there exists a need to provide a solution to solve the aforesaid problems.

SUMMARY

An object of the present disclosure is to provide a method that is capable of transferring the heat to semiconductor works without the disadvantages of conventional heat transfer methods. In other words, the present disclosure will bring out lower peak temperature, good temperature uniformity, and much easier control in temperature profile in thermal process of semiconductor packaging assembly. The present disclosure also provides an apparatus to apply the thermal process onto semiconductor works by vapor condensation heat transfer of liquid perfluorinated compounds (PFC). The apparatus is comprised of a closable process chamber in which a semiconductor work is placed, an overheated vapor generation unit, a condense filter unit, a condensation compensation unit and a control unit with related conduits. The apparatus also includes vacuum means and nitrogen gas supply to reduce the pressure inside the process chamber so as to maintain oxygen-less atmosphere inside the process chamber before injecting the overheated vapor. As the high-pressure overheated vapor is injected into the process chamber, the overheated vapor becomes saturated vapor in atmosphere (1 ATM) immediately and generates condensed liquid film onto all the surface of the semiconductor work and also the chamber walls as condensation phenomenon occurs. The process temperature of vapor condensation is very close to and never exceeds the boiling point of perfluorinated compounds (PFC) in the process chamber. Therefore, the latent heat of the saturated vapor is transferred to the semiconductor work through the surface of liquid film evenly and uniformly.

Another object of the present disclosure is to provide a method and apparatus to perform the differential heating onto the semiconductor work by applying the vapor condensation heat transfer on the top side of the semiconductor work and by applying the lower temperature liquid perfluorinated compounds (PFC) immersion conduction heat to the bottom side of the semiconductor work simultaneously.

This differential heating method may effectively reduce the stress and warpage level in the substrate and heterogeneous chip combination during the thermal process and also improve the manufacturing yield in semiconductor packaging assembly.

The present disclosure may be applied to the processes in semiconductor 3D-IC packaging assembly, such as soldering reflow, fluxless reflow bonding, thermal compression bonding and TLP (transient liquid phase) bonding processes. The present disclosure may also improve the manufacturing yield of those processes due to the merits of lower peak temperature, no overheat, good uniformity in temperature distribution and easy control of the temperature profile.

The foregoing, as well as additional objects, features and advantages of the disclosure will be more readily apparent from the following detailed description, which proceeds with reference to the accompanying drawings.

BRIEF DESCRIPTION OF THE DRAWINGS

FIG. 3-1 is a locally enlarged view of FIG. 3.

FIG. 4-1 is a locally enlarged view of FIG. 4.

FIG. 5-1 is a locally enlarged view of FIG. 5.

DETAILED DESCRIPTION OF THE PREFERRED EMBODIMENT

Liquid perfluorinated compounds (PFCs) (such as Galden from Solvay Solexis, Fluorinert from 3M, and Krytox from DuPont) have the following characteristics: high dielectric strengths, acceptable thermal conductivities, and being also inert and safe. Therefore, many applications that use liquid perfluorinated compounds as heat transfer fluids (HTFs) in semiconductor fields become more and more popular since 2000s. The main applications are listed below.

1) In the manufacture process of semiconductor devices, the heat transfer fluids serve as coolants in chillers and remove extra heat during manufacturing processes. In semiconductor device testing processes, the heat transfer fluid containers are cooled or heated to a set temperature into which the devices are immersed to test their integrity. Moreover, the heat transfer fluids are used to remove the heat that the devices generate during test when finishing the testing function of devices.

2) The heat transfer fluids are also used to attach semiconductor devices to circuit boards via solder, which may be melted by the vapor of heat transfer fluids that is heated to its boiling point. This heat transfer process is so called as condensation heat transfer.

3) The heat transfer fluids may also serve to cool semiconductor devices and other devices or systems that generate high heat during operation (such as CVD process).

The present disclosure is to use the liquid perfluorinated compounds (PFCs) to develop the method and apparatus in thermal process of semiconductor packaging assembly, which has the characteristics of lower peak temperature, stabilizing and minimizing the variation in temperature distribution, and reducing the warpage level of the substrate 135 (such as silicon wafer or organic substrate) and the heterogeneous chip combination (thin silicon chips 131, thick silicon chips 137 and stacking silicon chips 133) during the process. To increase the efficiency of heat transfer, the present disclosure applies the latent heat to HTFs by means of overheated vapor method. On the other hand, the present disclosure also provides an immersion differential heating method to reduce the warpage of the substrate 135. The related description and explanation of the present disclosure will be shown in details below.

Figure 1:
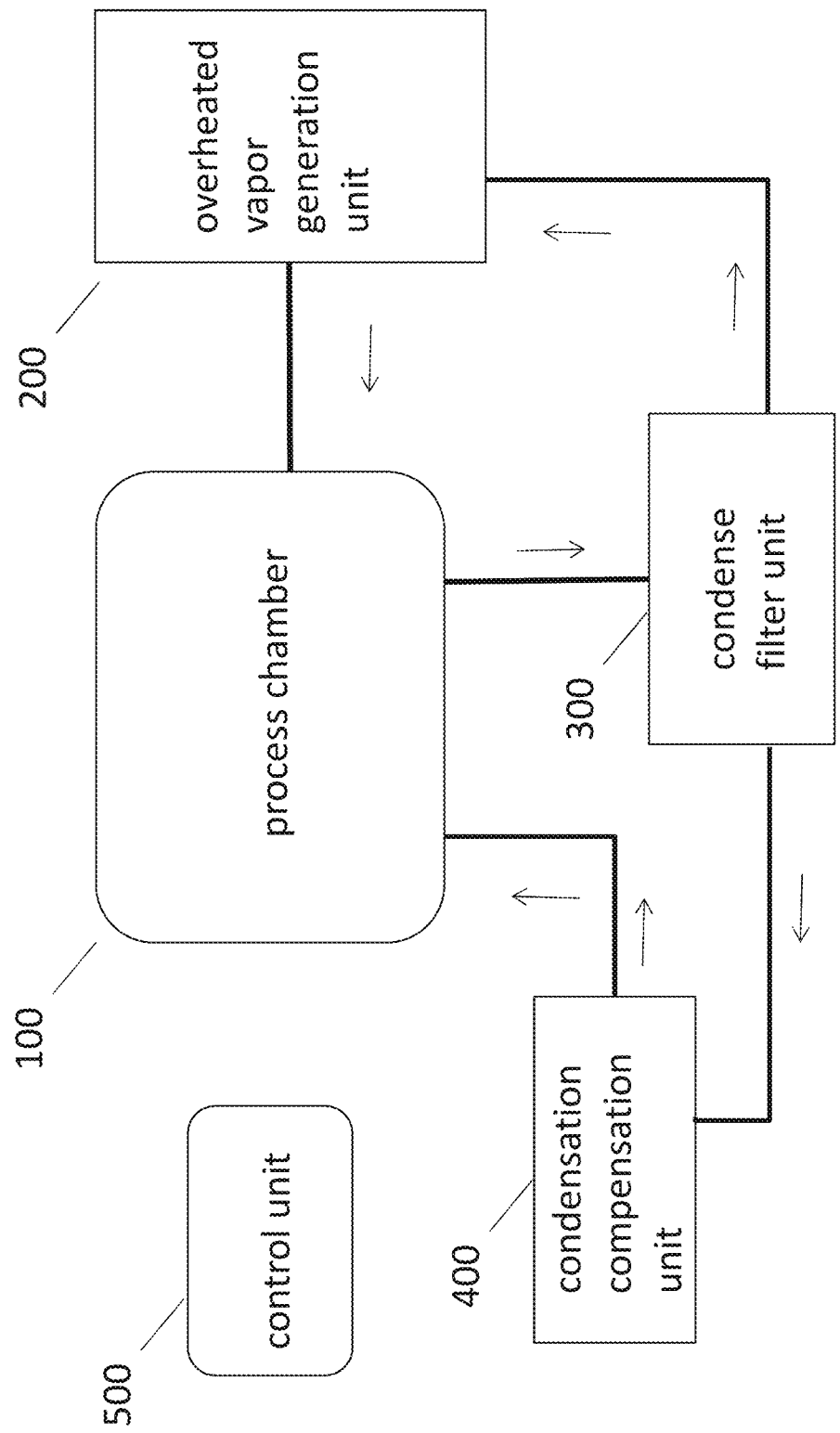
FIG. 1 is a block diagram illustrating the system of thermal process in packaging assembly of semiconductor according to the present disclosure.

Reference is made to FIG. 1, which is a block diagram illustrating the system of thermal process in packaging assembly of semiconductor according to the present disclosure. The system of the present disclosure includes a process chamber 100, an overheated vapor generation unit 200, a condense filter unit 300, a condensation compensation unit 400 and a control unit 500. The process chamber 100 may be a closable container that applies the thermal process to the semiconductor work 121 illustrated in FIG. 3 by condensing the overheated vapor. The overheated vapor generation unit 200 applies the heat to the liquid heat transfer fluid (HTF) and turns it into the overheated vapor. The condense filter unit 300 provides the condensed liquid heat transfer fluid (HTF) with or without the saturated vapor to the condense filter tank by passing the cooling coils and filter. The condensation compensation unit 400 may adjust the vapor condensation rate by injecting the controlled low temperature liquid heat transfer fluid (HTF) into the process chamber 100. The control unit 500 may control and operate the system by means of related temperature, pressure, and liquid level sensors. The system of the present disclosure is a closed-loop system and ensures the recycle usage of HTFs.

Figure 2:
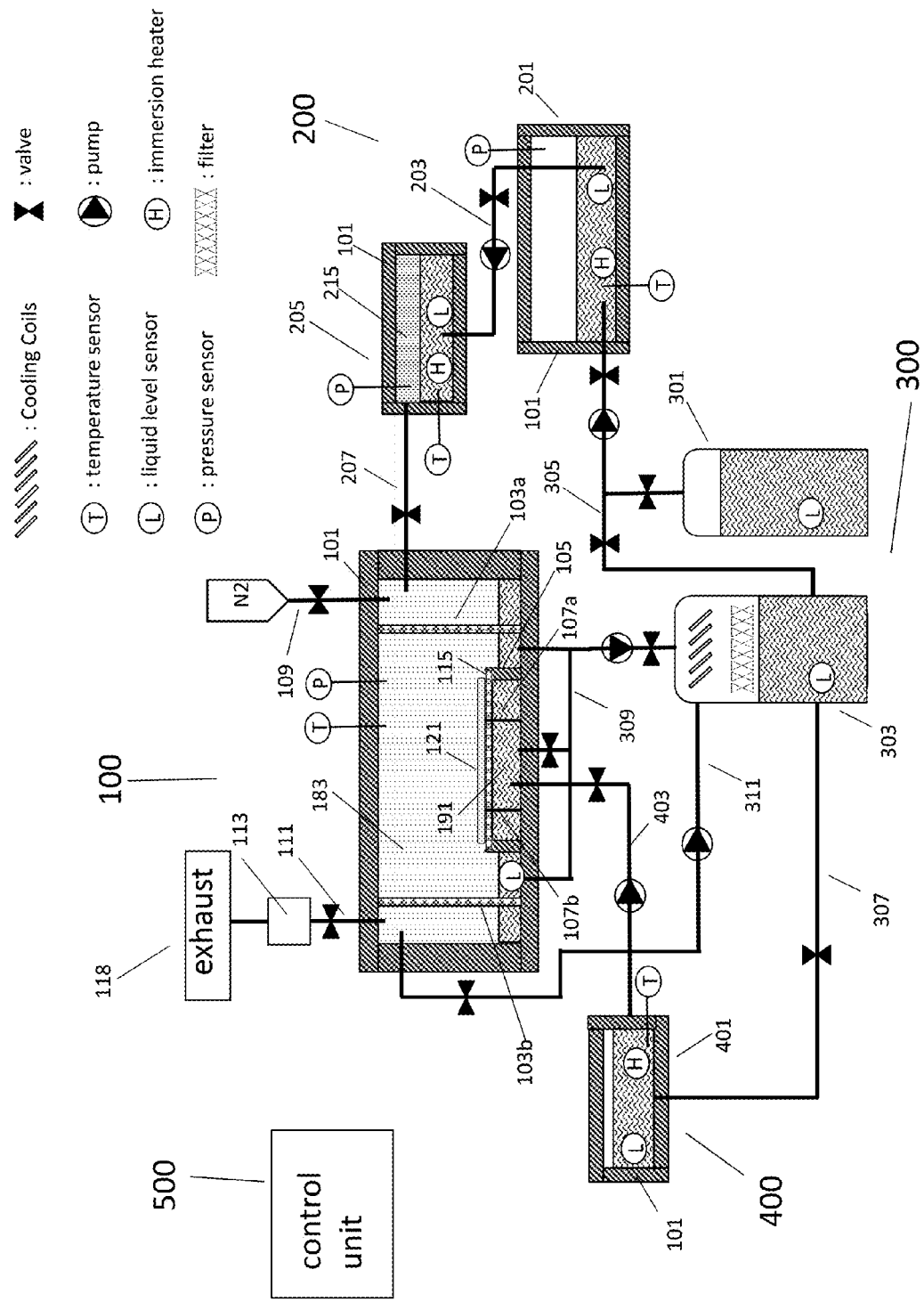
FIG. 2 is a detailed diagram illustrating the system of thermal process in packaging assembly of semiconductor according to the present disclosure.
Figure 3:
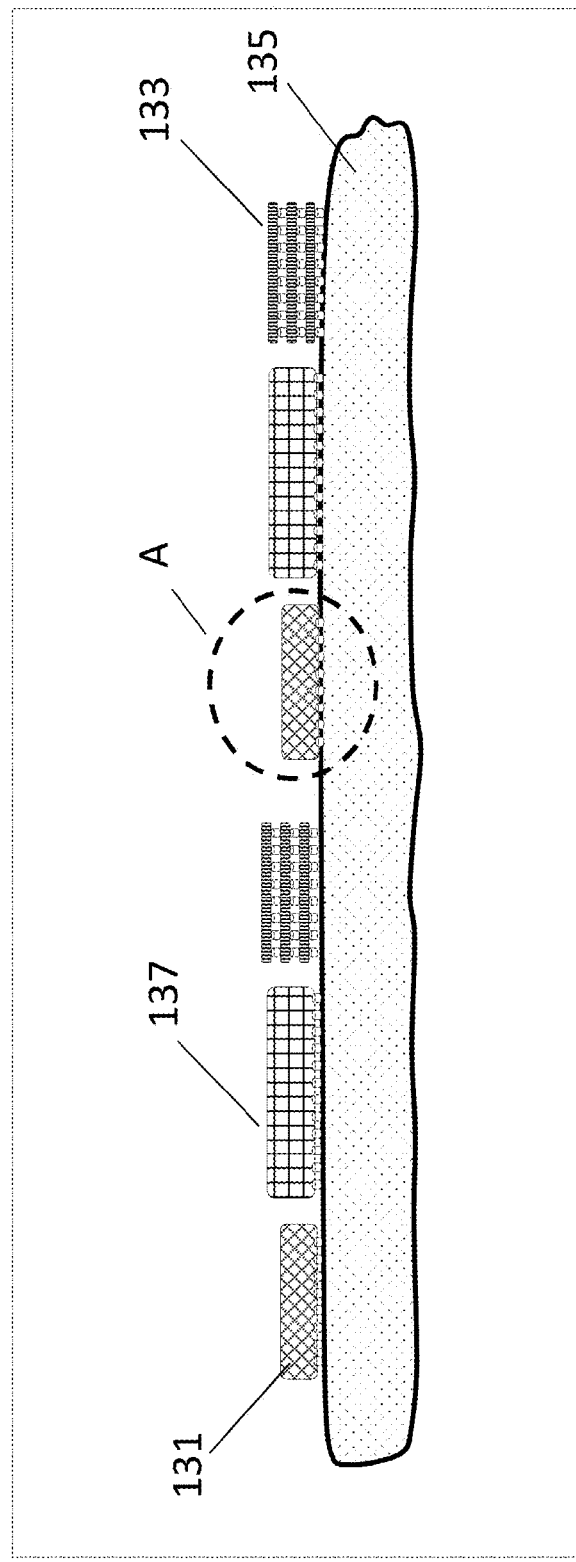
FIG. 3 is a cross-sectional view of a conventional semiconductor work.
Figures 1, 3:
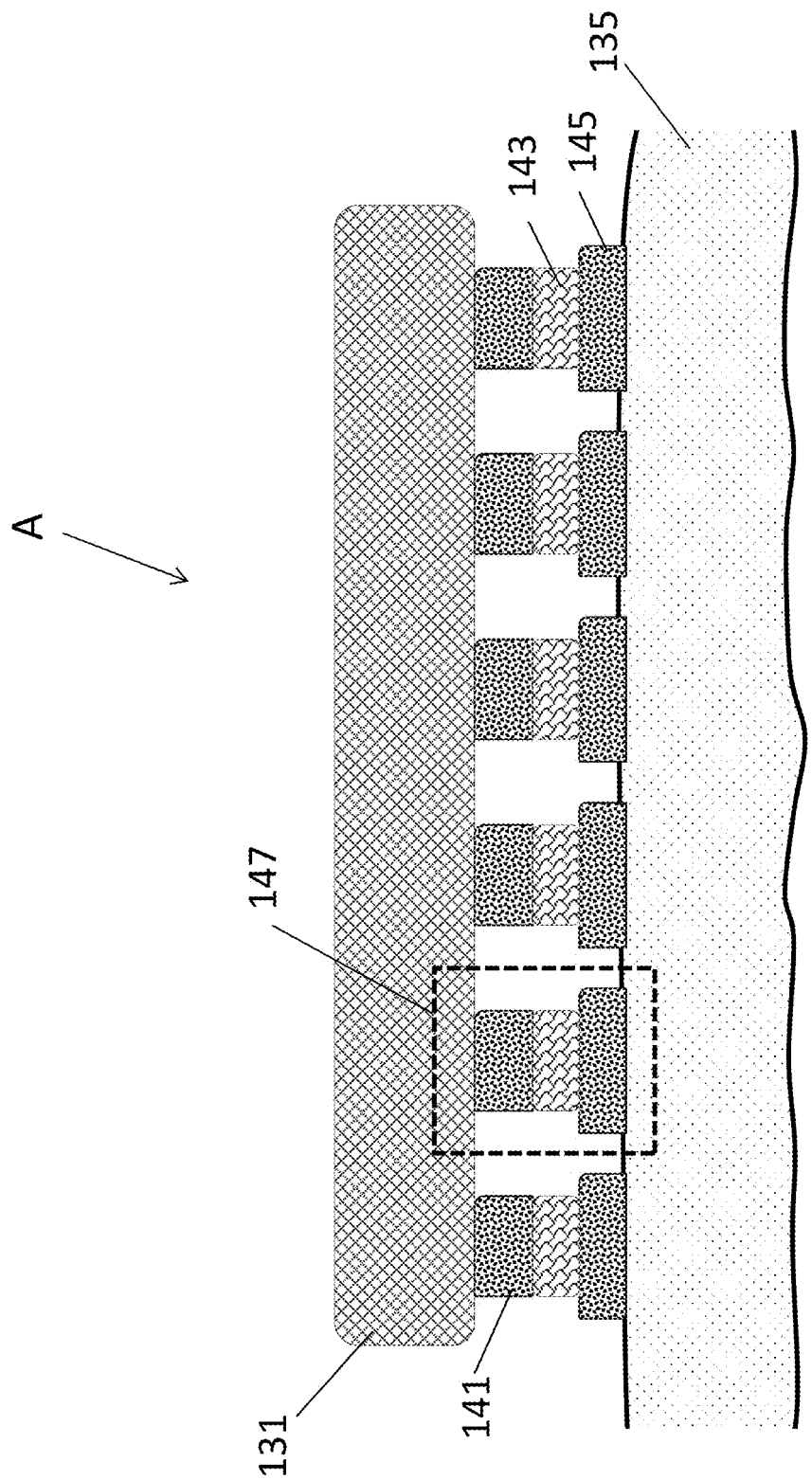
Figure 4:
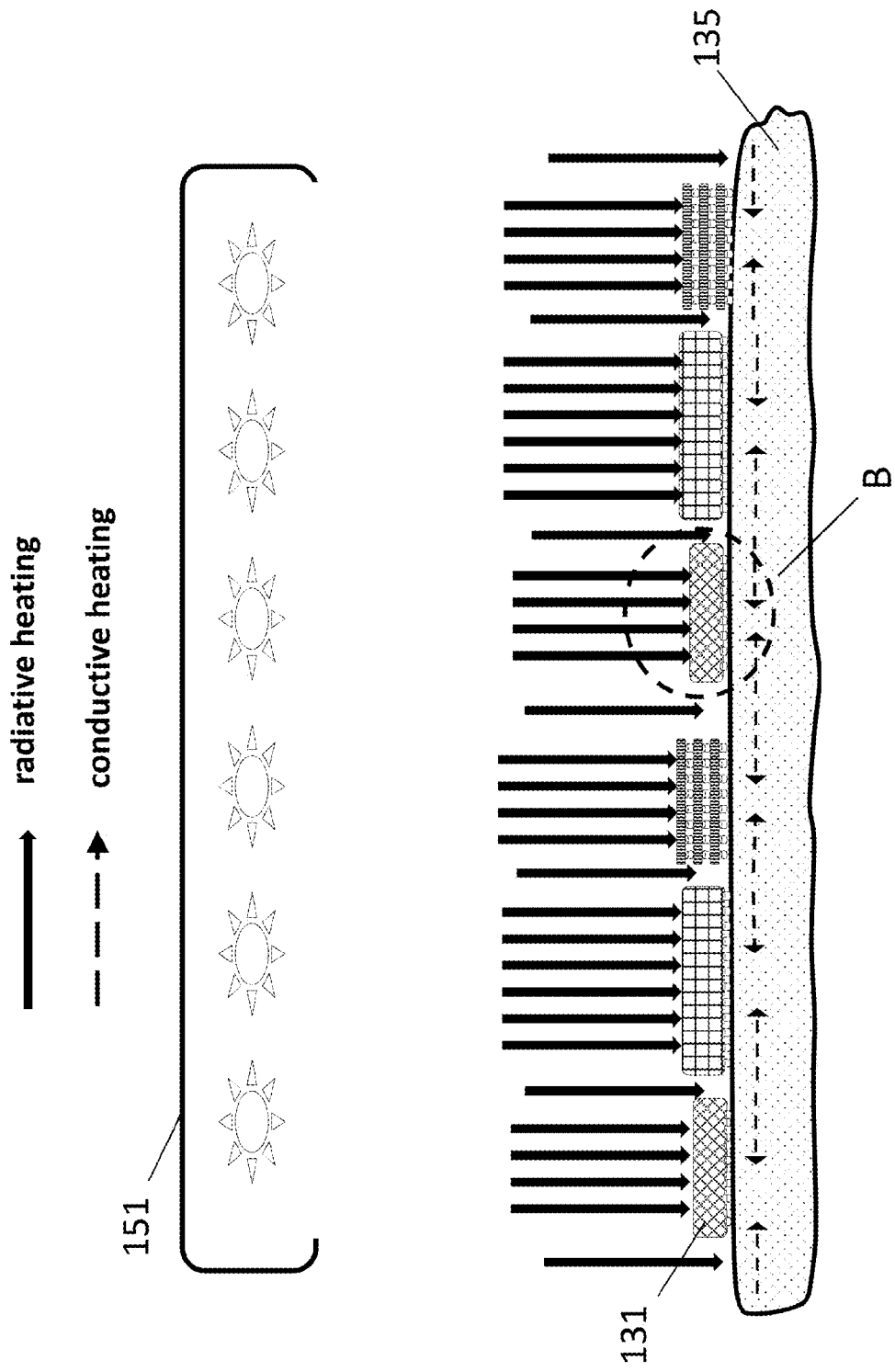
FIG. 4 is a schematic diagram illustrating a conventional radiation heating process.
Figures 1, 4:
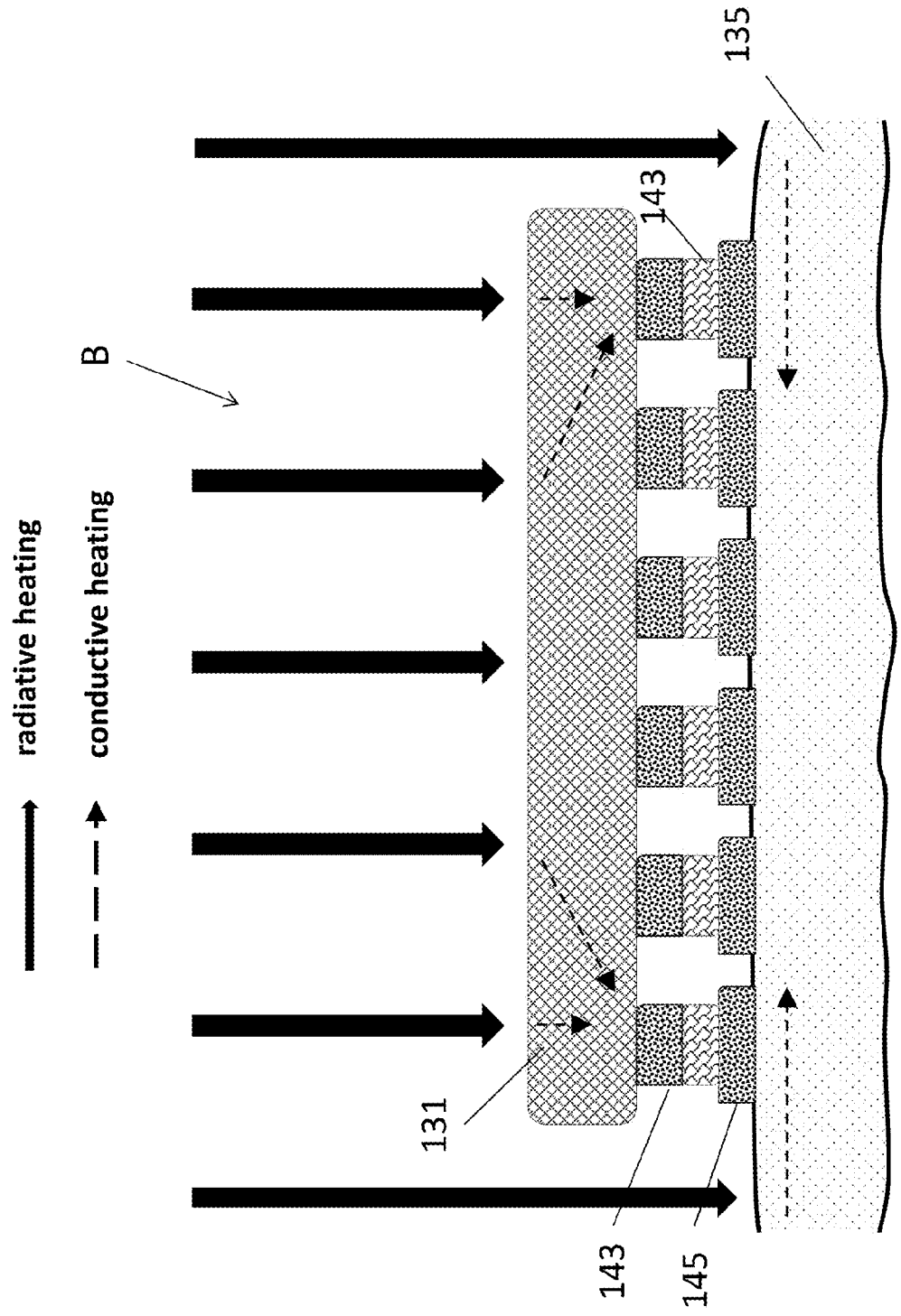
Figure 5:
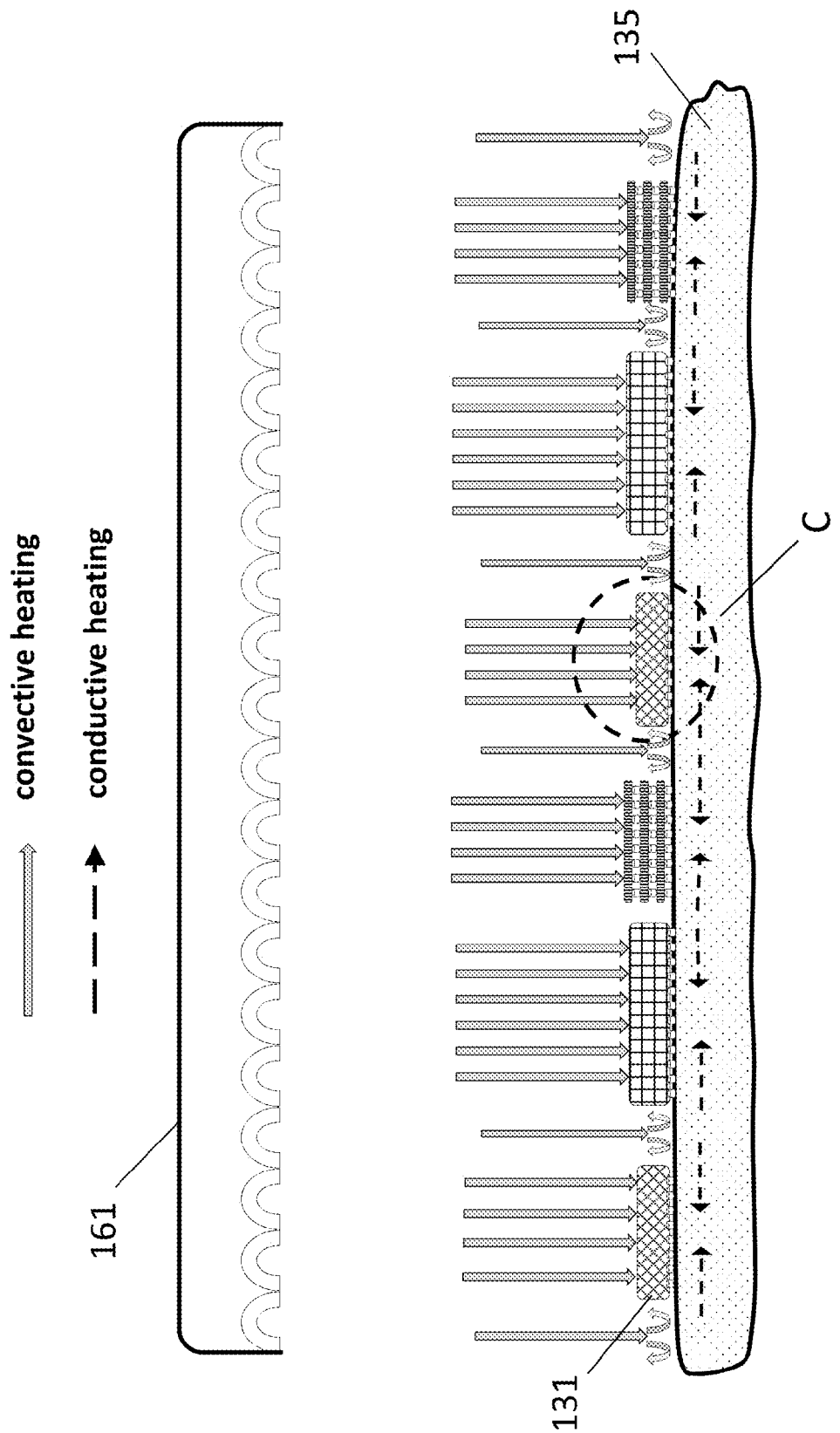
FIG. 5 is a schematic diagram illustrating a conventional convection heating process.
Figures 1, 5:
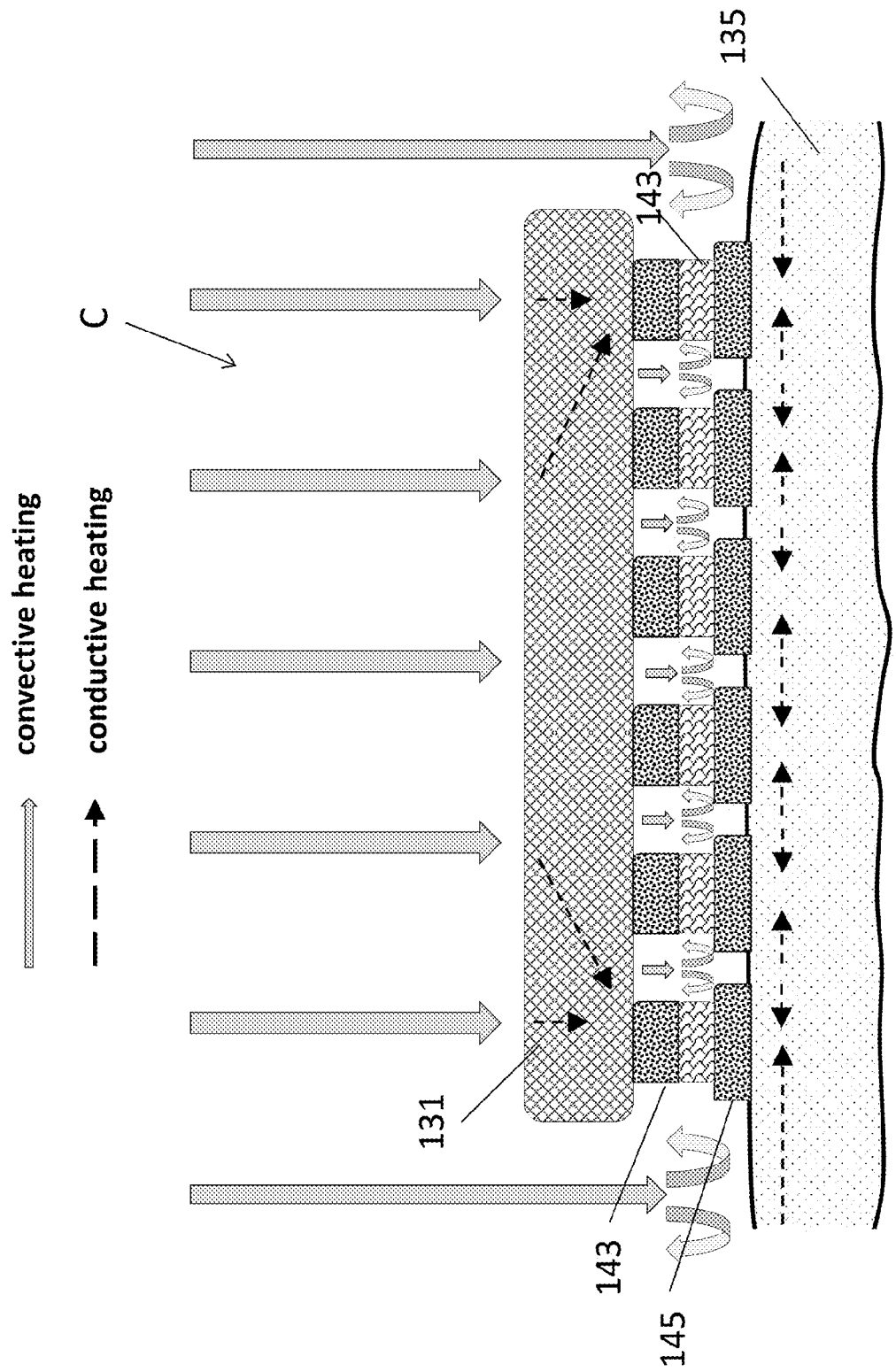
Figure 6:
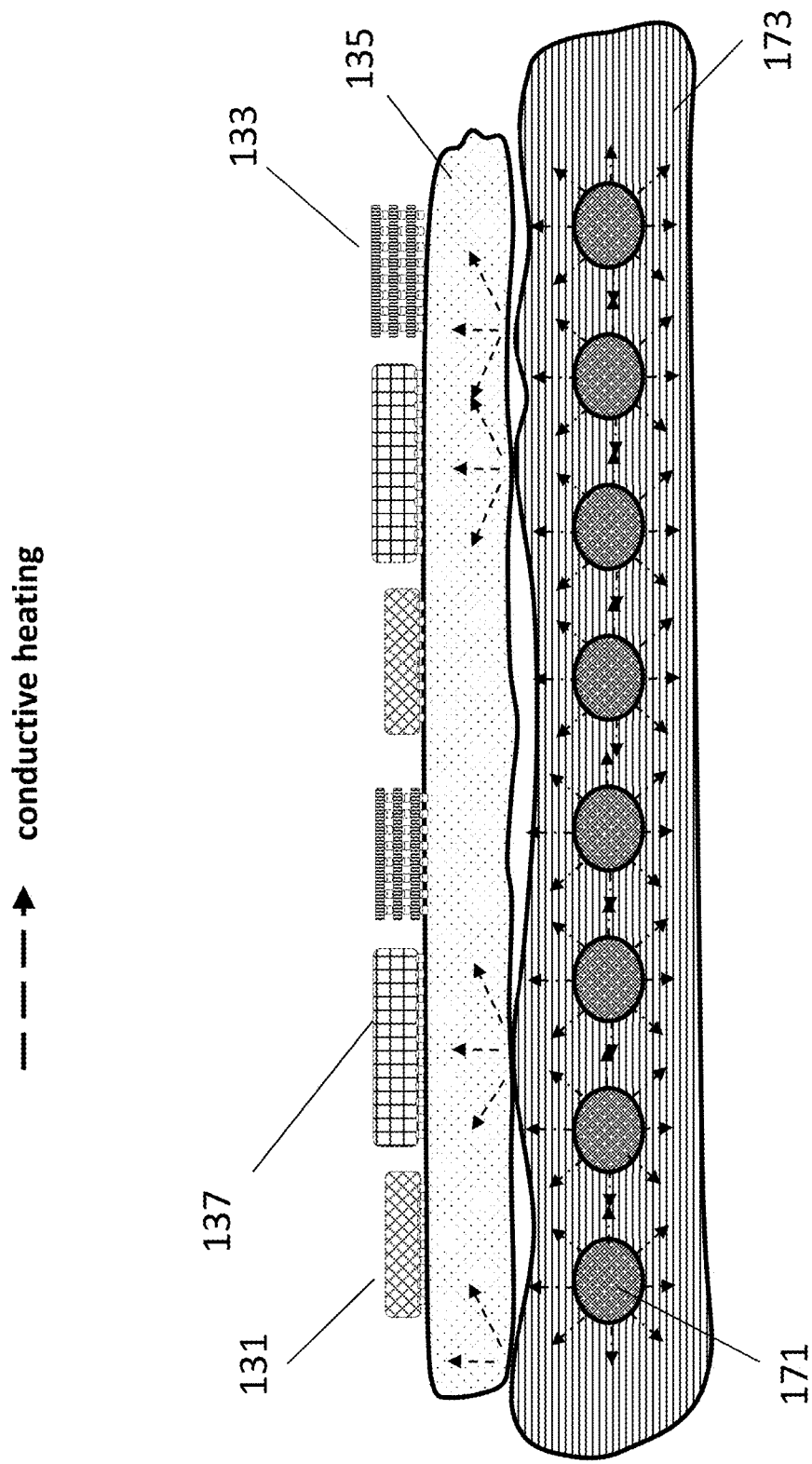
FIG. 6 is a schematic diagram illustrating a conventional conduction heating process.

FIG. 3 illustrates a semiconductor work 121 composed of a heterogeneous chip combination (thin silicon chip 131, thick silicon chip 137 and stacking silicon chips 133) and a substrate 135 (such as silicon wafer or organic substrate). Reference is made to FIG. 2, which is a detailed diagram illustrating the system of thermal process in packaging assembly of semiconductor according to the present disclosure. The semiconductor work 121 is ready in the process chamber 100 to perform a thermal process. The system of the present disclosure includes the process chamber 100 in which the semiconductor work 121 is placed. The overheated vapor generation unit 200 provides high-pressure overheated vapor to the process chamber 100 for interaction with the semiconductor work 121 during the thermal process. The condense filter unit 300 receives the condensed liquid and vapor from the process chamber 100. The condensation compensation unit 400 is provided with the feature to adjust the condensation rate and the latent heat of the saturated vapor inside the process chamber 100.

The process chamber 100 is composed of a closed chamber with heat block walls 101, in which the semiconductor work 121 is placed on a porous jig plate 115 over an overflow liquid tank 105. A conduit 207 introduces high-pressure overheated vapor from an overheated vapor generator 205 into the process chamber 100. Gas distribution plates 103a, 103b are positioned in the process chamber 100 so that the distribution of gas/vapor flow between the gas distribution plates 103a, 103b are even in the process chamber 100. Support pins 107a, 107b cooperate with automation handling robot to perform the load-in and load-out of the semiconductor work 121. A conduit 309 pumps out the condensed liquid to a condense filter tank 303. A conduit 311 pumps out the vapor/gas to the condense filter tank 303. A conduit 111 pumps out the vapor/gas inside the process chamber 100 to an exhaust 118 through a vacuum pump 113. A conduit 109 pumps facility nitrogen into the process chamber 100. As the door of the process chamber 100 is opened, automation handling robot takes the semiconductor work 121 out from a semiconductor magazine to the process chamber 100. The support pins 107a, 107b lift up and protrude out from the upper surface of the porous jig plate 115. The semiconductor work 121 is then placed on the top of the support pins 107a, 107b by the automation handling robot. Afterward, the support pins 107a, 107b lift down. As the door of the process chamber 100 is closed, the conduit 111 pumps out the air inside the process chamber 100 and then the conduit 109 pumps nitrogen into the process chamber 100. The above process keeps the process chamber 100 in less oxygen environment and the semiconductor work 121 is ready for thermal process. The active condensation heat transfer mechanism is to switch the valve of the conduit 207 to control the injection of the overheated vapor into the process chamber 100, to switch the valve and pump of the conduit 311 to expel the gas/vapor into the condense filter tank 303, and to switch the valve and pump of the conduit 309 to discharge the condensed liquid into the condense filter tank 303. Moreover, the active condensation heat transfer mechanism is also to switch the valve and pump of the conduit 403 to inject the controlled lower temperature liquid heat transfer fluid (HTF) into the overflow liquid tank 105 for controlling the vapor condensation rate precisely.

The overheated vapor generation unit 200 is composed of a pre-heating tank 201 and an overheated vapor generator 205. A conduit 305 pumps liquid heat transfer fluid (HTF) from a heat transfer fluid tank 301 into the pre-heating tank 201. The pre-heating tank 201 heats the heat transfer fluid (HTF) to the pre-setting temperature that is lower than the boiling point of the heat transfer fluid (HTF) in the process chamber 100. A conduit 203 pumps the heated heat transfer fluid (HTF) into the overheated vapor generator 205. The overheated vapor generator 205 heats the injected liquid heat transfer fluid (HTF) into overheated vapor by high efficient immersion heater H. Afterward the overheated vapor is injected into the process chamber 100 by the control unit 500.

The condense filter unit 300 is composed of the heat transfer fluid tank 301 and the condense filter tank 303. The conduit 311 receives the vapor/gas from the process chamber 100 to the condense filter tank 303 by passing the gas distribution plate 103b. The conduit 309 receives the condensed liquid from the process chamber 100 to the condense filter tank 303. The conduit 305 pumps out the cooling liquid heat transfer fluid from the heat transfer fluid tank 301 and condense filter tank 303 into the pre-heating tank 201.

The condensation compensation unit 400 is a closed chamber 401 with heat block walls 101 to receive the heat transfer fluid from the condense filter tank 303 and heat the heat transfer fluid to pre-set lower temperature. The heat transfer fluid is then pumped into the overflow liquid tank 105 inside the process chamber 100 by the control unit 500. The control unit 500 operates all the valves, pumps and heater by computer program according the signals coming from all the liquid level sensors L, temperature sensors T and pressure sensors P.

Figure 7:
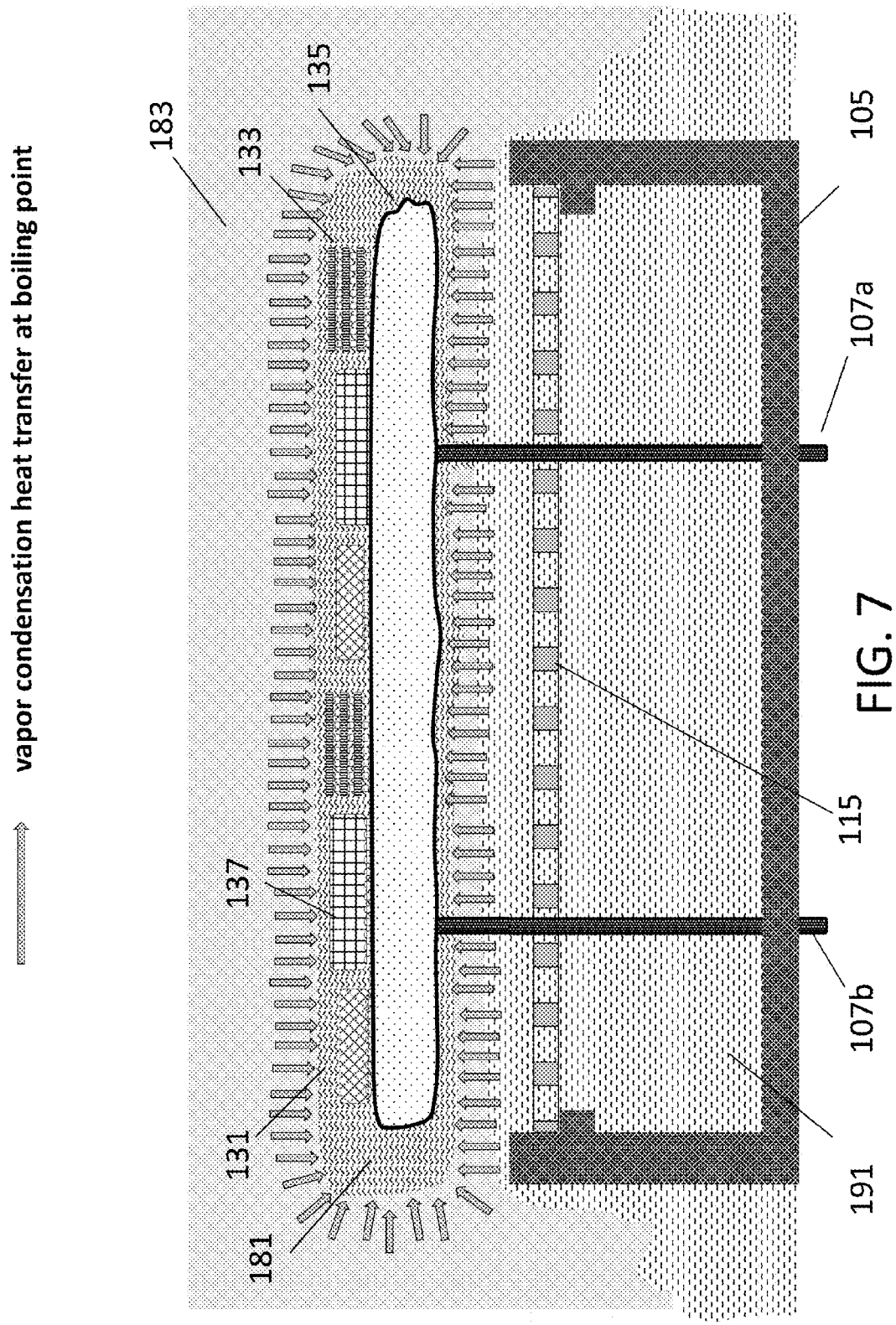
FIG. 7 is a schematic diagram illustrating the method for thermal process in packaging assembly of semiconductor according to the present disclosure.

FIG. 7 illustrates that the semiconductor work 121 is placed on the top of the support pins 107a, 107b and the support pins 107a, 107b lift up the semiconductor work 121 so that the bottom side of the semiconductor work 121 does not contact the liquid heat transfer fluid (HTF) injected from the condensation compensation unit 400. The high-pressure overheated vapor injected from the overheated vapor generator 205 turns into saturated vapor 183 and fills the entire process chamber 100 quickly in atmosphere. Meanwhile all the surfaces of the semiconductor work 121, heat block walls 101, support pins 107a, 107b and gas distribution plates 103a, 103b will be covered with a thin condensed liquid film 181 except the overflow liquid tank 105 because it is covered with lower temperature liquid heat transfer fluid injected from the condensation compensation unit 400. The latent heat of the saturated vapor 183 will transfer the heat to the entire surface of the condensed liquid film 181 at the temperature that is close to and never exceeds the boiling point of the heat transfer fluid in the process chamber 100. Therefore, the vapor condensation heat transfer that applies to the surface of the semiconductor work 121 is very even and not subject to the shape of the semiconductor work 121. Meanwhile the lower temperature liquid heat transfer fluid may consume more the latent heat of the saturation vapor 183 to adjust the condensation rate of the saturation vapor 183.

Figure 8:
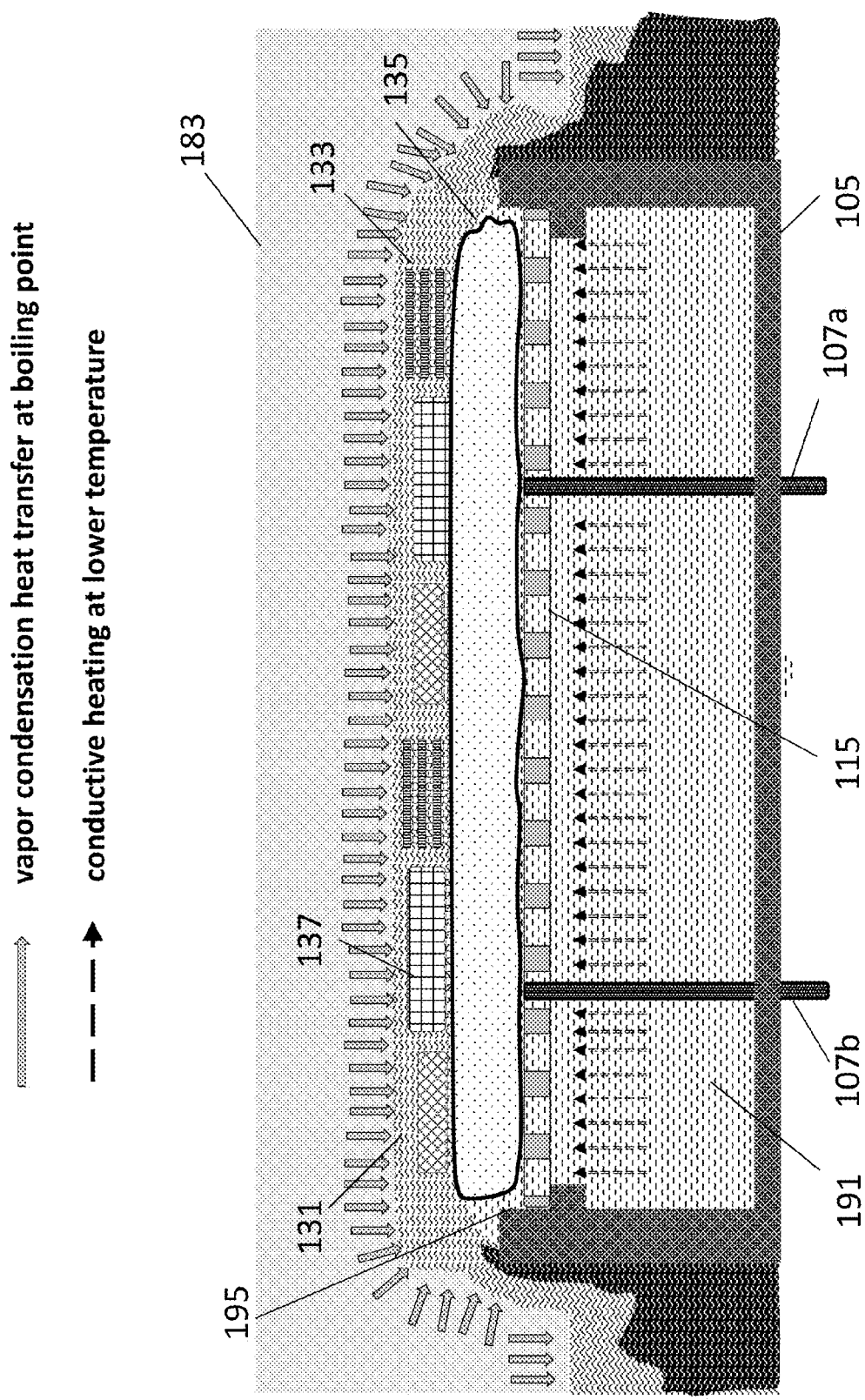
FIG. 8 is a schematic diagram illustrating the differential heating method for thermal process in packaging assembly of semiconductor according to the present disclosure.

FIG. 8 illustrates that the semiconductor work 121 is placed on the porous jig plate 115 and the differential heating is applied to it. The top side of the semiconductor work 121 is not in contact with the lower temperature liquid heat transfer fluid 191 and the bottom side of the semiconductor work 121 is in contact with the lower temperature liquid heat transfer fluid 191 that is injected from the condensation compensation unit 400. The condensation heat of the saturation vapor 183 transferred to the top surface of the semiconductor work 121 is very even and not subject to the shape of the semiconductor work 121. The immersion conduction heat transferred from the lower temperature liquid heat transfer fluid 191 to the bottom of the semiconductor work 121 is also stable because the overflow liquid is always kept at a preset temperate in the condensation compensation unit 400. Usually it will be much lower than the vapor condensation temperature, i.e. the boiling point of the heat transfer fluid and its exact value is set according to the warpage profile of the substrate 135. This differential heating method minimizes the warpage of the substrate 135 and the stress arising from the mismatch of coefficient of thermal expansion (CTE) between the substrate 135 and heterogeneous chip combination (thin silicon chips 131, thick silicon chips 137 and stacking silicon chips 133) during the thermal process. The gap 195 between the walls of the overflow liquid tank 105 and the edges of the porous jig plate 115 is preferably smaller than the thickness of the substrate 135 so that the overflow of the liquid heat transfer fluid 191 may run smoothly through the gap 195 to the outside of the overflow liquid tank 105.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A method for thermal process of a semiconductor work, comprising:

supplying a liquid compound to a process chamber, wherein the supplied liquid compound in the process chamber is at liquid state;

generating saturated vapor of the liquid compound in the process chamber; and positioning a semiconductor work in the process chamber such that a bottom side of the semiconductor work is in contact with the liquid compound and a top side of the semiconductor work is free of contact with the liquid compound.

2. The method as claimed in claim 1, wherein the step of generating the saturated vapor in the process chamber comprising:

providing an overheated vapor generator to generate overheated vapor of the liquid compound, wherein the overheated vapor has a temperature higher than the boiling point of the liquid compound in the chamber; and injecting the overheated vapor generated from the overheated vapor generator into the process chamber via a first conduit such that the injected overheated vapor is turned into the saturated vapor in the process chamber.

3. The method as claimed in claim 2, wherein the step of generating the overheated vapor in the overheated vapor generator comprising:

providing a pre-heating tank to heat the liquid compound to a predetermined temperature lower than the boiling point of the liquid compound in the process chamber;

injecting the heated liquid compound from the pre-heating tank into the overheated vapor generator; and heating the injected liquid compound from the pre-heating tank into the overheated vapor of the liquid compound by the overheated vapor generator.

4. The method as claimed in claim 2, further comprising:

positioning a first gas distribution plate in the process chamber to be between the semiconductor work and an end of the first conduit at the process chamber.

5. The method as claimed in claim 3, further comprising:

providing a condense filter tank to receive the vapor from the process chamber via a second conduit;

condensing and filtering the received vapor to the liquid compound by the condense filter tank; and outputting the liquid compound from the condense filter tank to the pre-heating tank.

6. The method as claimed in claim 5, further comprising:

positioning a second gas distribution plate in the process chamber to be between the semiconductor work and an end of the second conduit at the process chamber.

7. The method as claimed in claim 5, further comprising:

providing a heat transfer fluid tank to supply the liquid compound to the pre-heating tank.

8. The method as claimed in claim 1, further comprising:

providing a condensation compensation unit to supply the liquid compound to the process chamber thereby absorbing the latent heat of the saturated vapor, wherein the liquid compound in the condensation compensation unit has a preset temperature.

9. The method as claimed in claim 5, further comprising:

supplying the liquid compound from the condense filter tank to a condensation compensation unit; and supplying the liquid compound from the condensation compensation unit to an overflow liquid tank positioned in the process chamber.

10. The method as claimed in claim 5, further comprising:

receiving the liquid compound from the process chamber to the condense filter tank.

11. The method as claimed in claim 8, further comprising:

positioning an overflow liquid tank in the process chamber to receive the liquid compound supplied from the condensation compensation unit, wherein the liquid compound supplied from the condensation compensation unit to the overflow liquid tank has a pre-set temperature; and positioning a porous jig plate in the process chamber to carry the semiconductor work.

12. The method as claimed in claim 11, wherein the porous jig plate is positioned above the overflow liquid tank, and gaps formed between walls of the overflow liquid tank and edges of the porous jig plate are smaller than a thickness of the substrate.

13. The method as claimed in claim 1, wherein the liquid compound is a perfluorinated compound.

14. The method as claimed in claim 1, wherein the semiconductor work has a substrate to carry chips, the substrate is in contact with the condensed liquid compound in the process chamber.

* * * * *